US012690411B2

(12) United States Patent　　　　　(10) Patent No.:　US 12,690,411 B2

Shrivastava et al.　　　　　　　　　　(45) Date of Patent:　　　Jul. 21, 2026

(54) METHODS AND APPARATUS FOR PROCESSING A SUBSTRATE

(71) Applicant: Applied Materials, Inc., Santa Clara, CA (US)

(72) Inventors: Gaurav Shrivastava, Bengaluru (IN); Pavankumar Ramanand Harapanhalli, Bangalore (IN); Yao-Hung Yang, Santa Clara, CA (US); Sudhir R. Gondhalekar, Fremont, CA (US); Chih-Yang Chang, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 1099 days.

(21) Appl. No.: 17/748,270

(22) Filed: May 19, 2022

(65) Prior Publication Data

US 2023/0402304 A1　　Dec. 14, 2023

(51) Int. Cl.
| | |
|---|---|
| *H10P 72/00* | (2026.01) |
| *C23C 16/44* | (2006.01) |
| *C23C 16/52* | (2006.01) |
| *G01K 7/04* | (2006.01) |
| *G01K 7/22* | (2006.01) |

(52) U.S. Cl.
CPC ............ *H10P 72/0602* (2026.01); *G01K 7/04* (2013.01); *G01K 7/223* (2013.01)

(58) Field of Classification Search
None
See application file for complete search history.

(56) References Cited

U.S. PATENT DOCUMENTS

| | | | |
|---|---|---|---|
| 6,367,410 B1 * | 4/2002 | Leahey | ............. H01L 21/67103 |
| | | | 118/724 |
| 7,066,194 B2 * | 6/2006 | Ku | ...................... F16K 27/0236 |
| | | | 137/341 |
| 9,423,179 B2 | 8/2016 | Wieland et al. | |
| 2007/0031609 A1 | 2/2007 | Kumar et al. | |
| | (Continued) | | |

FOREIGN PATENT DOCUMENTS

| | | | | | |
|---|---|---|---|---|---|
| TW | 463209 B | * | 11/2001 | ............. | H01L 21/02 |

OTHER PUBLICATIONS

International Search Report for PCT/US2023/020644, dated Aug. 29, 2023.

*Primary Examiner* — Sylvia Macarthur

(74) *Attorney, Agent, or Firm* — Moser Taboada

(57) ABSTRACT

Methods and apparatus for processing a substrate are provided herein. For example, a processing volume for processing a substrate and a pressure system in fluid communication with the processing volume and comprising a throttle valve assembly including a housing, a sensing device disposed in an interior of the housing, and a fan open to the interior of the housing, wherein, during operation of the pressure system to control a pressure within the processing volume, the sensing device is responsive to temperature changes in the interior of the housing such that the fan remains off when a temperature of the interior of the housing is less than a predetermined temperature and automatically turns on when the temperature within interior of the housing is equal to or greater than the predetermined temperature.

19 Claims, 3 Drawing Sheets

(56)         References Cited

U.S. PATENT DOCUMENTS

| 2013/0284721 A1* | 10/2013 | Yang ................. H01L 21/67248 |
| | | 219/553 |
| 2014/0020837 A1* | 1/2014 | Nguyen ................... H05H 1/46 |
| | | 156/345.48 |
| 2014/0367264 A1* | 12/2014 | Wilson ................. C25D 17/008 |
| | | 205/83 |
| 2015/0093909 A1 | 4/2015 | Murata et al. |
| 2016/0144675 A1* | 5/2016 | Knepple .............. B60C 23/001 |
| | | 137/12 |
| 2017/0125270 A1 | 5/2017 | Choi et al. |
| 2017/0350038 A1* | 12/2017 | Lo ..................... H01L 21/02046 |
| 2019/0057879 A1 | 2/2019 | Delmas et al. |
| 2021/0172064 A1 | 6/2021 | Moon |
| 2023/0402304 A1* | 12/2023 | Shrivastava ...... H01L 21/67253 |

* cited by examiner

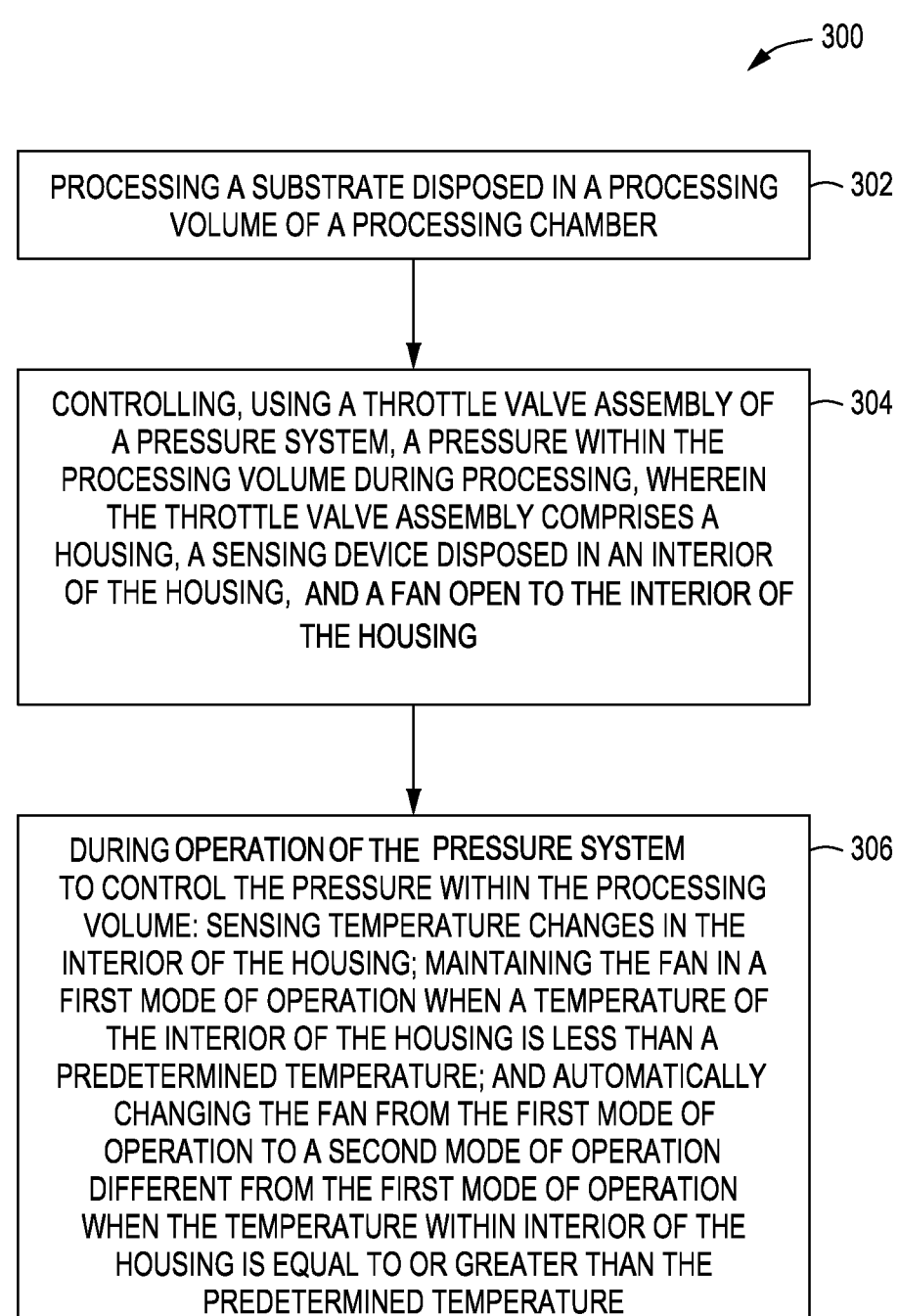

300

PROCESSING A SUBSTRATE DISPOSED IN A PROCESSING VOLUME OF A PROCESSING CHAMBER ⟋ 302

CONTROLLING, USING A THROTTLE VALVE ASSEMBLY OF A PRESSURE SYSTEM, A PRESSURE WITHIN THE PROCESSING VOLUME DURING PROCESSING, WHEREIN THE THROTTLE VALVE ASSEMBLY COMPRISES A HOUSING, A SENSING DEVICE DISPOSED IN AN INTERIOR OF THE HOUSING, AND A FAN OPEN TO THE INTERIOR OF THE HOUSING ⟋ 304

DURING OPERATION OF THE PRESSURE SYSTEM TO CONTROL THE PRESSURE WITHIN THE PROCESSING VOLUME: SENSING TEMPERATURE CHANGES IN THE INTERIOR OF THE HOUSING; MAINTAINING THE FAN IN A FIRST MODE OF OPERATION WHEN A TEMPERATURE OF THE INTERIOR OF THE HOUSING IS LESS THAN A PREDETERMINED TEMPERATURE; AND AUTOMATICALLY CHANGING THE FAN FROM THE FIRST MODE OF OPERATION TO A SECOND MODE OF OPERATION DIFFERENT FROM THE FIRST MODE OF OPERATION WHEN THE TEMPERATURE WITHIN INTERIOR OF THE HOUSING IS EQUAL TO OR GREATER THAN THE PREDETERMINED TEMPERATURE ⟋ 306

FIG. 3

METHODS AND APPARATUS FOR PROCESSING A SUBSTRATE

FIELD

Embodiments of the present disclosure generally relate to a methods and apparatus for processing a substrate and, for example, to methods and apparatus that use an electronic heat controlled throttle valve.

BACKGROUND

Substrate (wafer) fabrication can include one or more processes. For example, substrate fabrication can include using one or more deposition processes (e.g., physical vapor deposition (PVD), chemical vapor deposition (CVP), atomic layer deposition (ALD), etc.), one or more etch processes (e.g., wet etch, dry etch, etc.), degas processes, and one or more polishing processes (e.g., chemical mechanical polishing (CMP) or other suitable polishing processes).

Pressure is an important factor that needs to be controlled within a processing volume of a processing chamber during operation of the above one or more processes. Typically, one or more controllers are configured to control the pressure within a processing volume using, for example, a throttle valve. As process recipes, however, sometimes require frequent on-off switching of the throttle valve, a relatively large amount of heat can sometimes be generated by a throttle valve motor. Additionally, during processing, heat can also be generated by a heater jacket used to maintain a relatively high heat (e.g., 150° C.) and generated via heat transfer caused by process gas flowing through a foreline. The generated heat, whether wanted or unwanted, can sometimes lead to unwanted electrical noise being generated and controller failure (e.g., printed circuit board (PCB) failure), both of which can result in less than preferable substrate fabrication outcomes. Additionally, as it is often not practical to replace the PCB after failure, a user usually needs to replace the entire throttle valve, which can be expensive and can reduce throughput, as the processing chamber is not operable during replacement of the throttle valve.

Thus, the inventors have provided improved methods and apparatus that use an electronic heat controlled throttle valve.

SUMMARY

Methods and apparatus for substrate processing are provided herein. In some embodiments, an apparatus for processing a substrate includes a processing chamber comprising a processing volume for processing a substrate and a pressure system in fluid communication with the processing volume and comprising a throttle valve assembly including a housing, a sensing device disposed in an interior of the housing, and a fan open to the interior of the housing, wherein, during operation of the pressure system to control a pressure within the processing volume, the sensing device is responsive to temperature changes in the interior of the housing such that the fan remains off when a temperature of the interior of the housing is less than a predetermined temperature and automatically turns on when the temperature within interior of the housing is equal to or greater than the predetermined temperature.

In accordance with at least some embodiments, a pressure system configured for use with a processing chamber comprises a throttle valve assembly including a housing, a sensing device disposed in an interior of the housing, and a fan open to the interior of the housing, wherein, during operation of the pressure system to control a pressure within a processing volume, the sensing device is responsive to temperature changes in the interior of the housing such that the fan remains off when a temperature of the interior of the housing is less than a predetermined temperature and automatically turns on when the temperature within interior of the housing is equal to or greater than the predetermined temperature.

In accordance with at least some embodiments, a method of processing a substrate comprises processing a substrate disposed in a processing volume of a processing chamber, controlling, using a throttle valve assembly of a pressure system, a pressure within the processing volume during processing, wherein the throttle valve assembly comprises a housing, a sensing device disposed in an interior of the housing, and a fan open to the interior of the housing and during operation of the pressure system to control the pressure within the processing volume sensing temperature changes in the interior of the housing, maintaining the fan in a first mode of operation when a temperature of the interior of the housing is less than a predetermined temperature, and automatically changing the fan from the first mode of operation to a second mode of operation different from the first mode of operation when the temperature within interior of the housing is equal to or greater than the predetermined temperature.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 3 is a flowchart of a method for processing a substrate using the vacuum processing chamber and the throttle valve assembly of FIG. 1 and FIG. 2, respectively, in accordance with at least some embodiments of the present disclosure.

Figure 1:
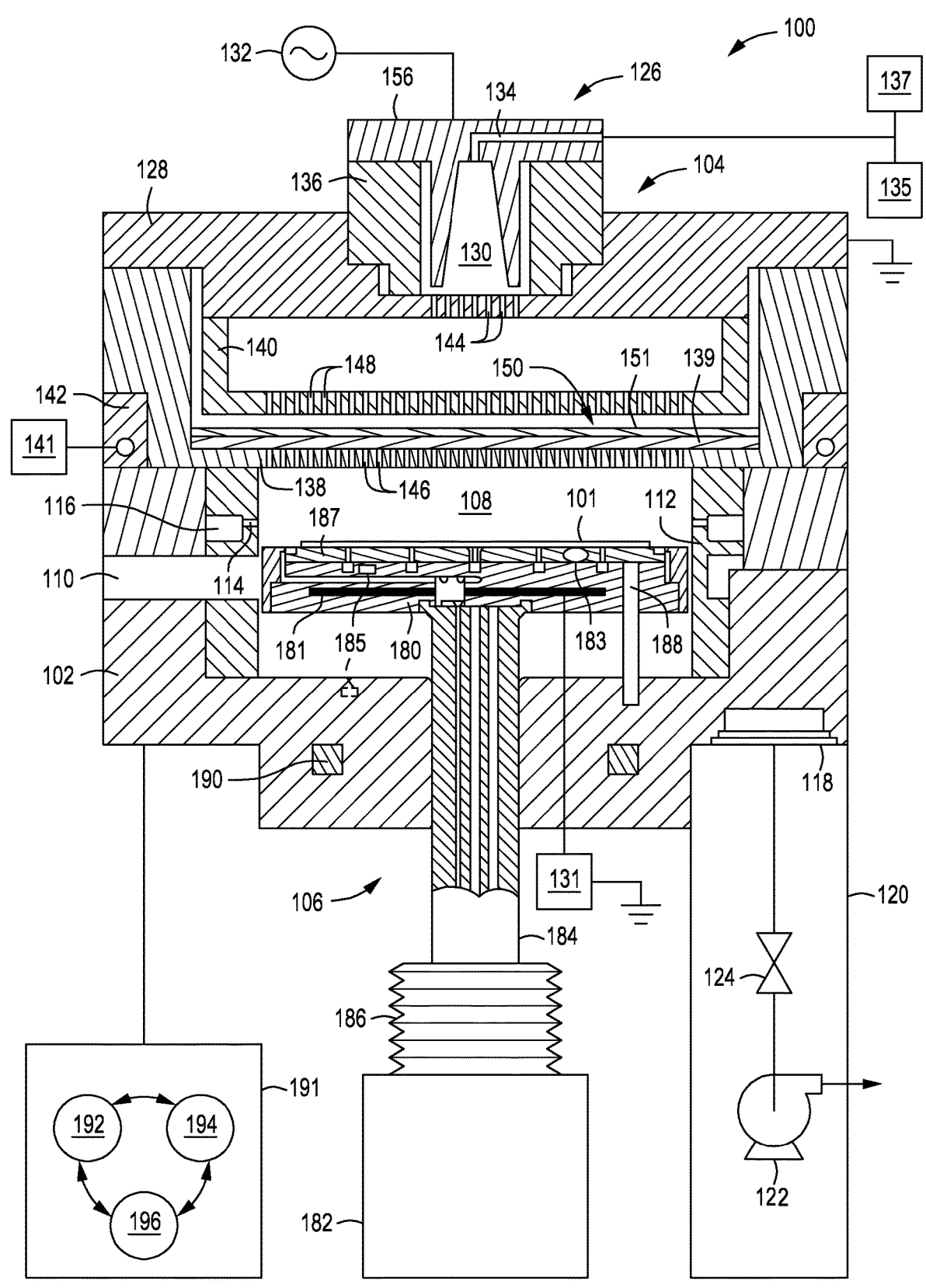
FIG. 1 is a partial cross-sectional view of a vacuum processing chamber, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus that use an electronic heat controlled throttle valve are provided herein. For example, a pressure system configured for use with a processing chamber can comprise a throttle valve assembly including a housing, a sensing device disposed in an interior of the housing, a throttle valve connected to the housing, and a fan open to the interior of the housing. In at least some embodiments, during on-off switching of the throttle valve to control a pressure within a processing volume, the sensing device is responsive to temperature changes in the interior of the housing such that the fan remains off when a temperature of the interior of the housing is less than a predetermined temperature and automatically turns on when the temperature within interior of the housing is equal to or greater than the predetermined temperature.

The methods and apparatus described herein decrease unwanted electrical noise that can sometimes be generated during operation of the pressure system, which can improve substrate fabrication, and can increase an operational life of the pressure system (e.g., a throttle valve controller), which can increase overall throughput (e.g., reduce processing chamber downtime).

FIG. 1 is a schematic cross-sectional view of a processing chamber 100 (vacuum processing chamber) for processing a substrate, in accordance with at least some embodiments of the present disclosure. Examples of suitable vacuum processing chambers for incorporation of the apparatuses described herein include physical vapor deposition (PVD) chambers, chemical vapor deposition (CVD) deposition chambers, degas chambers, etc., all of which are available from Applied Materials, Inc., of Santa Clara, California. The following processing chamber description is provided for context and exemplary purposes and should not be interpreted or construed as limiting the scope of the disclosure. For illustrative purposes, the processing chamber 100 is described herein as a CVD chamber configured for transistor fabrication. For example, in at least some embodiments, the CVD chamber can be configured for use with process recipes used in FinFET fabrication (e.g., less than 7 nm node).

The processing chamber 100 includes a chamber body 102, a lid assembly 104, and a support assembly 106. The lid assembly 104 is positioned at an upper end of the chamber body 102. The support assembly 106 is disposed in a processing volume 108, defined by the chamber body 102. The chamber body 102 includes a slit valve opening 110 formed in a sidewall thereof. The slit valve opening 110 is selectively opened and closed to allow access to the processing volume 108 by a substrate handling robot (not shown) for substrate transfer.

The chamber body 102 may further include a liner 112 that surrounds the support assembly 106. The liner 112 may be made of a metal such as (Al), a ceramic material, or any other process compatible material. In one or more embodiments, the liner 112 includes one or more apertures 114 and a pumping channel 116 formed therein that is in fluid communication with a vacuum port 118. The apertures 114 provide a flow path for gases into the pumping channel 116. The pumping channel 116 provides an egress for the gases within the processing chamber 100 to the vacuum port 118.

A pressure system 120 (vacuum system) can be configured to maintain a desired pressure (e.g., a relatively low processing chamber pressure) inside the processing chamber 100 and configured to exhaust (e.g., pumping down) the processing volume 108 of the processing chamber 100. For example, in at least some embodiments, the vacuum port 118 can be coupled to a pump 122 via a throttle valve assembly 124 for exhausting the processing volume 108 of the processing chamber 100 and maintaining a desired pressure inside the processing chamber 100, e.g., maintaining a relatively high pressure during a cleaning process and a relatively low pressure (e.g., vacuum) during substrate processing (e.g., FinFET processing), or vice versa.

The lid assembly 104 includes at least two stacked components configured to form a plasma volume or cavity therebetween. In one or more embodiments, the lid assembly 104 includes a first electrode ("upper electrode") 126 disposed vertically above a second electrode ("lower electrode") 128. The first electrode 126 and the second electrode 128 confine a plasma cavity 130, therebetween. The first electrode 126 is coupled to a power source 132, such as an RF power supply. The second electrode 128 is connected to ground, forming a capacitor between the first electrode 126 and second electrode 128. The first electrode 126 is in fluid communication with a gas inlet 134 that is connected to a gas supply 135, which provides gas, which can be energized to create an active process gas (e.g., ionized plasma or radicals), to the processing chamber 100 via the gas inlet 134 for performing one or more processes (e.g., deposition process, etch process, cleaning process, etc.). The first end of the one or more gas inlets 134 opens into the plasma cavity 130.

Alternatively or additionally, the gas supply 135 can be coupled to a remote plasma source (RPS) 137 that is configured to supply the plasma or radicals, depending on the configuration of the RPS, to the plasma cavity 130 of the processing chamber 100.

The lid assembly 104 may also include an isolator ring 136 that electrically isolates the first electrode 126 from the second electrode 128. The isolator ring 136 may be made from aluminum oxide (AlO) or any other insulative, processing compatible, material.

The lid assembly 104 may also include showerhead 150 and, optionally, a blocker plate 140. The showerhead 150 includes a gas distribution plate 138, a backing (gas) plate 139, and a chill plate 151. The second electrode 128, the gas distribution plate 138, the chill plate 151, and the blocker plate 140 may be stacked and disposed on a lid rim 142, which is coupled to the chamber body 102 and can function as a temperature-control ring, as described in more detail below.

The chill plate 151 is configured to regulate a temperature of the gas distribution plate 138 during processing. For example, the chill plate 151 may include one or more temperature control channels (not shown) formed therethrough such that a temperature control fluid may be provided therein to regulate the temperature of the gas distribution plate 138.

The second electrode 128 may include a plurality of gas passages 144 formed beneath the plasma cavity 130 to allow gas from the plasma cavity 130 to flow therethrough. The backing gas plate 139 may include one of more gas passages (not shown) and one or more gas delivery channels (not shown), thus allowing gas to flow from the one or more gas passages 217 and into the processing region. Similarly, the gas distribution plate 138 includes a plurality of apertures 146 configured to distribute the flow of gases therethrough. The blocker plate 140 may optionally be disposed between the second electrode 128 and the gas distribution plate 138. The blocker plate 140 includes a plurality of apertures 148 to provide a plurality of gas passages from the second electrode 128 to the gas distribution plate 138.

The support assembly 106 may include a support member 180 (e.g., a substrate support). The support member 180 is configured to support a substrate 101 (e.g., an epoxy substrate, a glass substrate, or a silicon substrate) for processing. The support member 180 may be coupled to a lift mechanism 182 through a shaft 184, which extends through a bottom surface of the chamber body 102. The lift mechanism 182 may be flexibly sealed to the chamber body 102 by a bellows 186 that prevents vacuum leakage from around the shaft 184. The lift mechanism 182 allows the support member 180 to be moved vertically within the chamber body 102 between a lower transfer portion and a number of raised process positions. For example, in at least some embodiments, the lift mechanism 182 is configured to position a substrate support surface 187 of the support member 180 from a substrate processing position a first distance away from the showerhead 150 to, for example, a cleaning position a second distance away from the showerhead 150, wherein the second distance is less than the first distance. Additionally, one or more lift pins 188 may be disposed through the support member 180 and coupled to a bottom surface of the substrate support surface 187. The one or more lift pins 188 are configured to extend through the support member 180 such that the substrate 101 may be raised off the surface of the support member 180. The one or more lift pins 188 may be active by a lift ring 190.

A heater 181 (e.g., one or more heating electrodes) can be provided in the support assembly 106 and can be configured to heat the support assembly 106 (e.g., to heat the substrate 101 during processing thereof and/or during a cleaning process of the showerhead 150). The heater 181 is coupled to a DC power source 131 to heat the support assembly 106 to a predetermined temperature, e.g., to heat the substrate 101 and/or the showerhead 150.

The processing chamber 100 may also include a controller 191. The controller 191 includes a central processing unit 192 (programmable) that is operable with a memory 194 and a mass storage device, an input control unit, and a display unit (not shown), such as power supplies, clocks, cache, input/output (I/O) circuits, and the liner 112, coupled to the various components of the processing system to facilitate control of the substrate processing. In at least some embodiments, the controller 191 can be coupled to one or more sensing devices that are disposed in the pressure system 120, e.g., via a wired or wireless connection, as described in greater detail below.

To facilitate control of the processing chamber 100 described above, the central processing unit 192 may be one of any form of general-purpose computer processor that can be used in an industrial setting, such as a programmable logic controller (PLC), for controlling various chambers and sub-processors. The memory 194 coupled to the central processing unit 192 and the memory 194 can be non-transitory computer readable storage medium and may be one or more of readily available memory such as random access memory (RAM), read only memory (ROM), floppy disk drive, hard disk, or any other form of digital storage, local or remote. Support circuits 196 are coupled to the central processing unit 192 for supporting the processor in a conventional manner. Charged species generation, heating, and other processes are generally stored in the memory 194, typically as software routine. The software routine may also be stored and/or executed by a second central processing unit (not shown) that is remotely located from the processing chamber 100 being controlled by the central processing unit 192.

The memory 194 is in the form of computer-readable storage media that contains instructions, that when executed by the central processing unit 192, facilitates the operation of the processing chamber 100. The instructions in the memory 194 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such non-transitory computer-readable storage media, when carrying computer-readable instructions that direct the functions of the methods described herein, are embodiments of the present disclosure.

Figure 2:
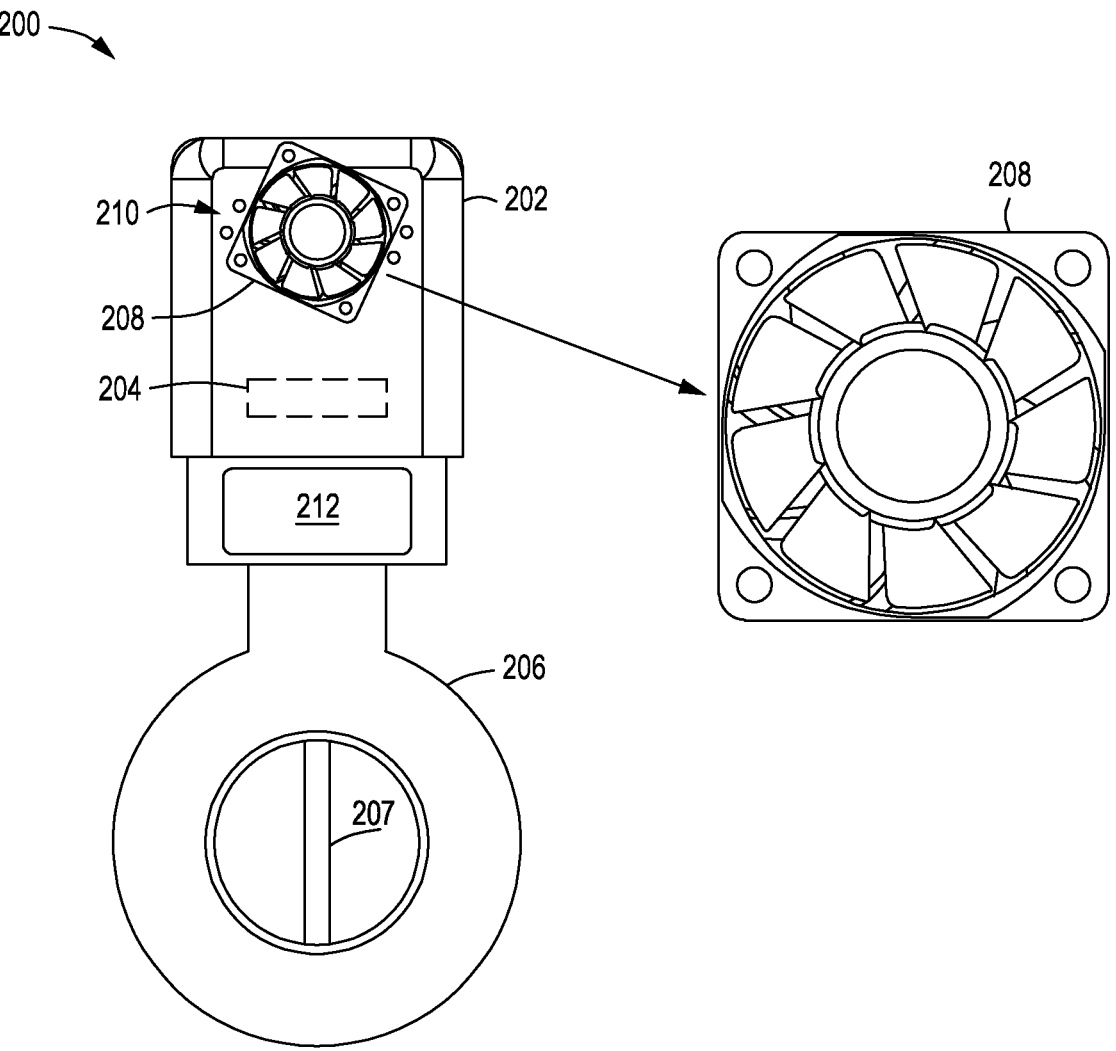
FIG. 2 is a throttle valve assembly configured for use with the vacuum processing chamber of FIG. 1, in accordance with at least some embodiments of the present disclosure.

FIG. 2 is a throttle valve assembly 200 (e.g., the throttle valve assembly 124) configured for use with the processing chamber 100 of FIG. 1, in accordance with at least some embodiments of the present disclosure. For example, the throttle valve assembly 200 comprises a housing 202, a sensing device 204 (shown in phantom) disposed in an interior of the housing 202, a throttle valve 206 connected to the housing 202, and a fan 208 open to (e.g., exposed to) the interior of the housing 202.

The sensing device 204 can be any suitable device capable of measuring/detecting temperature within the interior of the housing 202. For example, the sensing device 204 can be at least one of a thermocouple or a thermistor. For example, the sensing device 204 can be a thermistor. In at least some embodiments, the sensing device 204 can be a negative temperature coefficient thermistor.

The fan 208 can be any suitable type of fan that is capable cooling an interior of the housing 202 to a predetermined temperature. For example, the fan 208 is capable of maintaining the interior of the housing 202 to about 30° C. to about 50° C. In at least some embodiments, the fan 208 is capable of maintaining the interior of the housing 202 to a temperature that is less than 30° C. The fan 208 is open to the interior of the housing 202 via one or more apertures 210 defined through the housing 202. For example, in at least some embodiments, the fan is open to the interior of the housing 202 via a plurality of apertures 210 defined through the housing 202. The fan 208 can couple to the housing 202 via any suitable coupling device. For example, in at least some embodiments, the fan 208 can comprise one or more apertures that align with one or more corresponding threaded apertures that are configured to receive one or more screws. In at least some embodiments, the fan 208 can be coupled within an interior of the housing adjacent the plurality of apertures 210, using similar coupling devices.

The throttle valve 206 is adjustable to control flow rate of a process gas that is delivered into the processing volume 108 of the processing chamber 100. For example, in at least some embodiments, the throttle valve can be used to maintain the process gas at a process pressure of about 0.5 Torr to about 10 Torr or from about 2 Torr to about 5 Torr (e.g., about 2.5 Torr). For example, in at least some embodiments, a throttle controller 212 can be configured to control on-off switching of the throttle valve 206 to maintain the process gas at the process pressure during processing. For example, during on-off switching of the throttle valve 206 (a flapper 207 is shown in a fully opened configuration) to control a pressure within the processing volume 108, the sensing device 204 is responsive to temperature changes in the interior of the housing 202. For example, during operation the temperature changes in the interior of the housing 202 can be caused by heat generated by a motor (not shown) used for rapidly opening/closing the flapper 207, heat generated by a heater jacket (not shown) used around a flange (not shown), and/or heat transfer due to processes gases flowing through foreline (not shown) connected to throttle valve 206. In at least some embodiments, the fan 208 remains off when a temperature of the interior of the housing 202 is less than a predetermined temperature (e.g., 30° C.) and automatically turns on when the temperature within interior of the housing 202 is equal to or greater than the predetermined temperature (e.g., equal to or greater than 30° C. Additionally, in at least some embodiments, the throttle controller 212 can also control a current applied to the fan 208 to control a speed of the fan 208 when a temperature within interior of the housing 202 is equal to or greater than the predetermined temperature.

FIG. 3 is a flowchart of a method 300 for processing a substrate (e.g., the substrate 101, which can be an epoxy substrate, a glass substrate, or a silicon substrate) using the processing chamber 100 and the throttle valve assembly 200 of FIG. 1 and FIG. 2, respectively, in accordance with at least some embodiments of the present disclosure. For example, as noted above, the methods and apparatus described herein can be used to control unwanted noise that can sometimes be caused by excessive heat within the housing 202 of the throttle valve assembly 200 during operation.

At 302, the method 300 comprises processing a substrate disposed in a processing volume of a processing chamber (a chemical vapor deposition chamber). For example, in at least some embodiments, the method 300 can be used to perform one or more CVD processes on the substrate 101 for fabricating a field effect transistor (FET), e.g., a 7 nm FinFET, on the substrate 101.

Next, at 304, the method 300 comprises controlling, using a throttle valve assembly of a pressure system, a pressure within the processing volume during processing, wherein the throttle valve assembly comprises a housing, a sensing device disposed in an interior of the housing, a throttle valve connected to the housing, and a fan open to the interior of the housing. For example, during 302, the throttle controller 212 and/or the controller 191 can be configured to maintain a desired pressure (e.g., a relatively low processing chamber pressure) inside the processing chamber 100 and configured to exhaust (e.g., pumping down) the processing volume 108 of the processing chamber 100. For example, in at least some embodiments, the vacuum port 118 can be coupled to a pump 122 via the throttle valve assembly 124 for exhausting the processing volume 108 of the processing chamber 100 and maintaining a desired pressure inside the processing chamber 100, e.g., maintaining a relatively high pressure during a cleaning process and a relatively low pressure (e.g., vacuum) during substrate processing (e.g., FinFET processing), or vice versa.

Next, at 306, the method 300 can comprise, during processing (e.g., during one or more of the processes associated with the processing chamber 100), sensing temperature changes in the interior of the housing. In at least some embodiments, at 306, the method 300 can comprise sensing temperature changes in the interior of the housing, which as noted above can be caused by heat generated by a motor used for rapidly opening/closing the flapper 207, heat generated by a heater jacket used around a flange, and/or heat transfer due to processes gases flowing through foreline connected to throttle valve 206. For example, at 306, the sensing device 204 (e.g., negative temperature coefficient thermistor) can be configured to sense temperature within the interior of the housing 202 of the throttle valve assembly 200. For example, at 306, the method 300 comprises maintaining the fan in a first mode of operation when a temperature of the interior of the housing is less than a predetermined temperature and automatically changing the fan from the first mode of operation to a second mode of operation different from the first mode of operation when the temperature within interior of the housing is equal to or greater than the predetermined temperature. For example, in at least some embodiments, the fan 208 is in the first mode of operation (e.g., off) when a temperature within the interior of the housing 202 is less than about 30° C. to about 50° C., e.g., less than 30° C. Similarly, in at least some embodiments, the fan 208 is in the second mode of operation (e.g., on) when a temperature within the interior of the housing 202 is greater than about 30° C. to about 50° C., e.g., greater than 30° C.

In at least some embodiments, the sensing device 204 is configured such that a temperature increase within the interior of the housing 202 causes a decrease in resistance in the sensing device 204. When the decrease in resistance at the sensing device 204 reaches a predetermined impedance value, one or more power supplies (e.g., a DC power supply (not shown)) that is connected to the sensing device 204 (and/or the controller 191 or the throttle controller 212) is configured to provide power to the fan 208 so that the fan 208 turns on. Turning on the fan 208 exhausts/removes the hot air via the plurality of apertures 210 from the interior of the housing 202 and lowers the temperature within the interior of the housing 202. Likewise, when an increase in resistance at the sensing device 204 reaches a predetermined impedance value, the one or more power supplies is configured to not provide power to the fan 208 so that the fan 208 turns off. The fan 208 remains off mode until the temperature within the interior of the housing 202 is greater than or equal to the predetermined temperature, at which time the fan 208 will turn on again. Accordingly, during operation, the method 300 controls a temperature within the housing 202, which reduces, if not eliminates unwanted noise and improves overall substrate processing performance.

In at least some embodiments, as noted above, the throttle controller 212 (and/or the controller 191) can be configured to control the on-off switching of the throttle valve 206 and control a current applied to the fan 208. For example, in at least some embodiments, throttle controller 212 is configured to control a current applied to the fan 208 to control a speed of the fan 208 when the temperature within interior of the housing is equal to or greater than the predetermined temperature. For example, if the throttle controller 212 detects that a rate of change in temperature within the interior of the housing is equal to or greater than a predetermined value, the throttle controller 212 can be configured to increase current flow to the fan 208 to increase a speed of the fan 208 to rapidly cool the interior of the housing 202.

While the foregoing is directed to embodiments of the present disclosure, other and further embodiments of the disclosure may be devised without departing from the basic scope thereof.

The invention claimed is:

1. A processing chamber, comprising:
a processing volume for processing a substrate; and
a pressure system in fluid communication with the processing volume and comprising a throttle valve assembly including a housing, a sensor disposed in an interior of the housing, and a fan open to the interior of the housing, wherein, during operation of the pressure system to control a pressure within the processing volume, the sensor is responsive to temperature changes in the interior of the housing such that the fan remains off when a temperature of the interior of the housing is less than a predetermined temperature and automatically turns on when the temperature within interior of the housing is equal to or greater than the predetermined temperature.

2. The processing chamber of claim 1, wherein the sensor is at least one of a thermocouple or a thermistor.

3. The processing chamber of claim 2, wherein the thermistor is a negative temperature coefficient thermistor.

4. The processing chamber of claim 1, further comprising a throttle controller configured to control an on-off switching of a throttle valve of the throttle valve assembly and control a current applied to the fan to control a speed of the fan when the temperature within interior of the housing is equal to or greater than the predetermined temperature.

5. The processing chamber of claim 1, wherein the fan is open to the interior of the housing via an aperture defined therethrough.

6. The processing chamber of claim 1, wherein the fan is open to the interior of the housing via a plurality of apertures defined therethrough.

7. The processing chamber of claim 1, wherein the predetermined temperature is about 30° C. to about 50° C.

8. The processing chamber of claim 1, wherein the predetermined temperature is less than 30° C.

9. The processing chamber of claim 1, wherein the processing chamber is a chemical vapor deposition chamber configured to fabricate a field effect transistor (FET) on the substrate.

10. The processing chamber of claim 9, wherein the field effect transistor is a 7 nm FinFET.

11. A pressure system configured for use with a processing chamber, comprising:

a throttle valve assembly including a housing, a sensor disposed in an interior of the housing, and a fan open to the interior of the housing, wherein, during operation of the pressure system to control a pressure within a processing volume, the sensor is responsive to temperature changes in the interior of the housing such that the fan remains off when a temperature of the interior of the housing is less than a predetermined temperature and automatically turns on when the temperature within interior of the housing is equal to or greater than the predetermined temperature.

12. The pressure system of claim 11, wherein the sensor is at least one of a thermocouple or a thermistor.

13. The pressure system of claim 12, wherein the thermistor is a negative temperature coefficient thermistor.

14. The pressure system of claim 11, further comprising a throttle controller configured to control an on-off switching of a throttle valve of the throttle valve assembly and control a current applied to the fan to control a speed of the fan when the temperature within interior of the housing is equal to or greater than the predetermined temperature.

15. The pressure system of claim 11, wherein the fan is open to the interior of the housing via an aperture defined therethrough.

16. The pressure system of claim 11, wherein the fan is open to the interior of the housing via a plurality of apertures defined therethrough.

17. The pressure system of claim 11, wherein the predetermined temperature is about 30° C. to about 50° C.

18. The pressure system of claim 11, wherein the predetermined temperature is less than 30° C.

19. The pressure system of claim 11, wherein the pressure system is configured for use with a chemical vapor deposition chamber configured to fabricate a field effect transistor (FET) on a substrate.

* * * * *